(12) United States Patent
Tao et al.

(10) Patent No.: US 6,342,443 B1
(45) Date of Patent: Jan. 29, 2002

(54) METHOD AND STRUCTURE FOR FORMING FLIP CHIP WITH COLLAPSE-CONTROLLED SOLDER BUMPS ON A SUBSTRATE

(75) Inventors: Su Tao, Kaohsiung; Wei-Chung Wang, Kaohsiung Hsien; Jen-Kuang Fang, Pintong Hsien, all of (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 09/346,735

(22) Filed: Jul. 2, 1999

(51) Int. Cl.[7] ................ H01L 21/44; H01L 21/48; H01L 21/50
(52) U.S. Cl. ..................... 438/614; 438/108
(58) Field of Search .................. 438/108, 614

(56) References Cited

U.S. PATENT DOCUMENTS 5,290,732 A * 3/1994 Kumar .................. 437/183
6,107,180 A * 8/2000 Munroe ................ 438/613

* cited by examiner

*Primary Examiner*—Charles Bowers
*Assistant Examiner*—Nema Berezny
(74) *Attorney, Agent, or Firm*—Bacon & Thomas (57) ABSTRACT

A packaging process providing a die with C4 solder bumps and a polymer substrate first. It then jets the melted second solder onto each of the C4 solder bumps forming a second solder bump. After reflowing and leveling the solder bumps, the die is flipped and combined with the substrate. Then heat treatment proceeds with the combination of the die and the substrate forming a flip chip package with collapse-controlled solder bump on the polymer substrate.

13 Claims, 8 Drawing Sheets

METHOD AND STRUCTURE FOR FORMING FLIP CHIP WITH COLLAPSE-CONTROLLED SOLDER BUMPS ON A SUBSTRATE

BACKGROUND OF THE INVENTION

1. Field of the Invention

The present invention is related to the method of forming a flip die packaged on a substrate used in semiconductor packaging process. More particularly, the present invention is related to the method of forming a flip die with controlled collapse solder bumps packaged on a polymer substrate used in semiconductor packaging process.

2. Description of the Related Art

Flip die packages require consideration of solder bump properties of bonding and collapse control. The commonly used solder bump with better properties bonding and collapse control is the so-called C4 solder bump. It is necessary to adopt a ceramic substrate since the C4 solder bump has a high melting point (higher than 300° C.) and undergoes treatment at high temperatures. So, substrates with polymer material which cannot sustain such high temperatures are not suitable for the packaging of the flip die with a C4 solder bump, even thought the polymer substrates are more popular than the ceramic ones. Therefore, in choosing which type solder to use in the polymer substrate, melting point and bonding properties of the material must be considered.

Figure 10A:
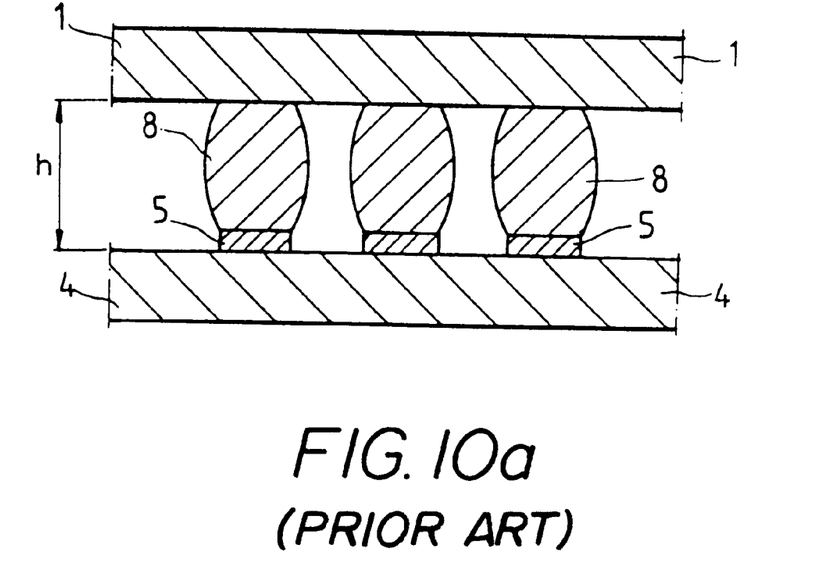
FIGS. 10a~10b: a sectional view of the result of collapse of solder bumps formed by another solder (not C4 solder).
Figure 10B:
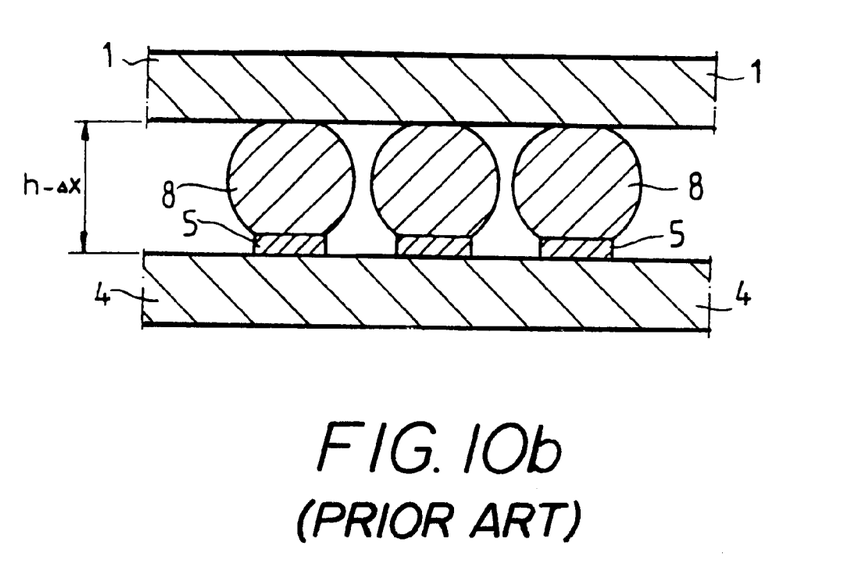

Solder with Sn/Pb alloy in the ratio of 63/37 is most popular for making flip die on polymer substrate at present. However, such solder causes the serious problem of collapse during the thermal treatment process. As illustrated in FIGS. 10a and 10b, solder bump 8 has collapsed at the end of the reflowing process, shrinking the stand-off between the die and the substrate. The stand-off distance is an important factor affecting the lifetime of the flip die package. Since the coefficient thermal expansion (CTE) of the die is different from that of the substrate, it will cause continuous transition of high/low temperatures while a die is in continuous operation by unavoidable ON/OFF switching. Short stand-off distance will cause the stress induced from thermal mismatch between the die and the substrate to increase, so that the lifetime of the die package will be decreased.

The method for adding solder with a lower melting point onto the pad of the substrate and then combining the die with solder bumps to the substrate by utilizing solder with a lower melting point to bond the solder bumps and substrate together is the main method utilized in prior art. The method of positioning the solder with a lower melting point is to first set a solder mask above the substrate and then spread solder paste with lower a melting point onto the mask. The apertures of the mask correspond to the position of the pads above the substrate, and the solder paste is thus spread on the pads of the substrate. However, the solder mask is formed by making a stencil necessary to make a different stencil for each type of mask, this increases the expense of making stencils. Also, if the solder paste touches the stencil, it causes the inevitable problem of pollution of solder paste.

SUMMARY OF INVENTION

The primary objective of this invention is to provide a method of producing a collapse-controlled flip die on a polymer substrate for an integrated circuit package. A second solder on the C4 solder bump forms a second solder bump, since the second solder has a lower melting point and collapse-controlled C4 solder bump, the second solder bump has a lower temperature for heat treatment that the polymer substrate can withstand and better collapse-controll property.

The secondary objective of this invention is to provide a method for producing a collapse-controlled flip die on a polymer substrate for the integrated circuit package that does not necessitate making a new stencil for different IC die in the process of forming second solder bumps, and the pollution from contact of solder and mask will be avoided. In accordance with the present invention, the method of making a mask for positioning of the solder is replaced in this invention by a jet method. In order to jet the droplets of melting solder onto the C4 solder bumps of the die, jetting equipment with a micro-computer and an auto-stage is adopted and the positions of the C4 solder bumps are put into the micro-computer, positioning printhead above the location for C4 solder bump jetting.

Other objectives, advantages and novel features of the invention will become more apparent from the following detailed description when taken in conjunction with the accompanying drawings.

BRIEF DESCRIPTION OF THE DRAWINGS

The present invention will now be described in detail with reference to the accompanying drawings wherein.

DETAILED DESCRIPTION OF THE INVENTION

The present invention is a method for making an IC package of flip die where the die is bonding directly to the polymer substrate with printed circuit, the solder bump for binding is melted and bonded at a lower temperature for reflowing and heat treatment, and the solder bump does not be collapse after the process of reflowing and heat treatment. In the present invention, the C4 (controlled-collapse chip connection) solder bumps are formed on the die first, then the second solder is formed on the C4 solder bump by jetting method. Given both the collapse-controlled property of the C4 solder bump and the lower melting point of the second solder, the non-collapsible solder bump for direct bonding of the die onto the polymer substrate, in accordance with the objectives of the present invention, will have been achieved.

Figure 1:
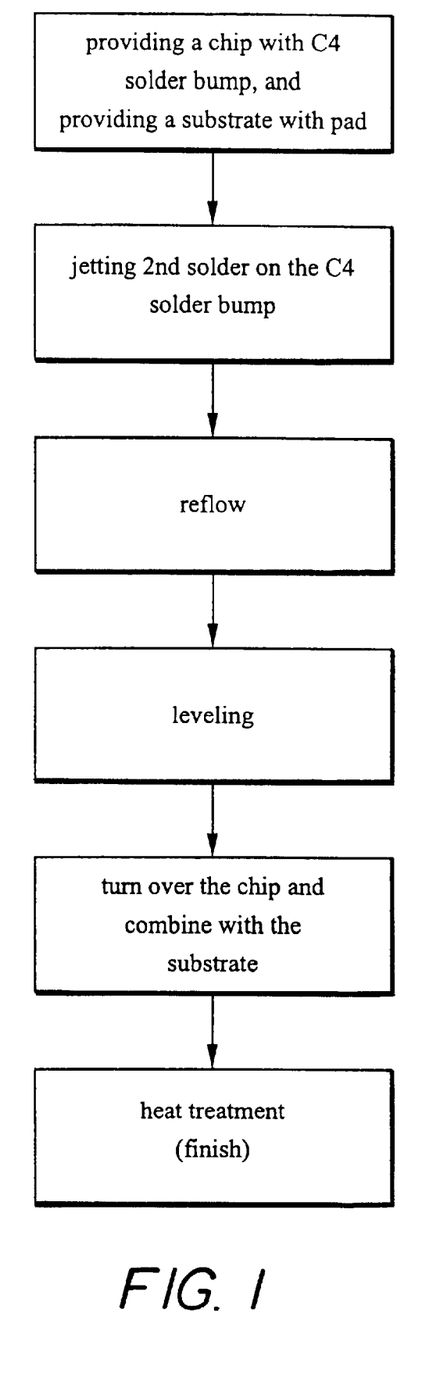
FIG. 1: a flow chart of the procedures for making a flip die package in accordance with the present invention.

FIG. 1 is a flowchart of the procedures in packaging according to the present invention. The process procedures of the present invention are comprised of the following steps (1) providing die 1 with C4 solder bump 2 and providing substrate 4 with metal pad 5;

(2) jetting droplet 31 of melted second solder onto C4 solder bump 2 to form a second solder bump 3;

(3) proceeding with the reflow treatment of the die with second solder bump 3 and forming an entire solder bump 8 by bonding second solder bump 3 with C4 solder bump 2;

(4) proceeding with the leveling treatment of an entire solder bump 8;

(5) flipping die 1 and combining the entire solder bump 8 onto metal pad 5;

(6) proceeding with the heat treatment of die combined with substrate 4 and bonding of the entirety of solder bumps 8 with metal pad 5.

Referring to FIGS. 2–8, there is a series of figures in sectional view that illustrate the physical embodiment in accordance with the present invention. It shows the results of the steps in the process of flip chip packaging.

Figure 2:
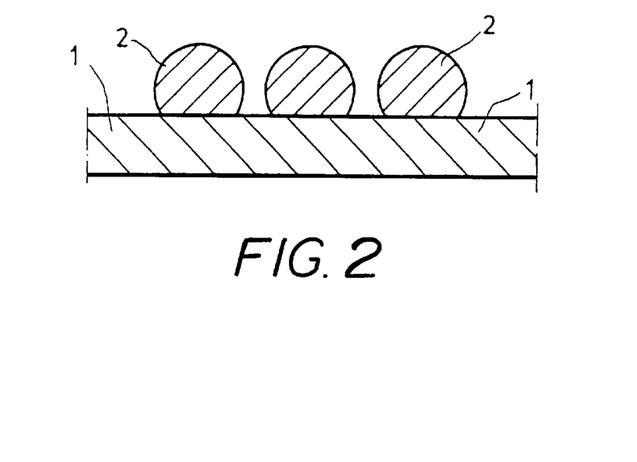
FIG. 2: a sectional view of a die with C4 solder bumps.

FIG. 2 illustrates step (1) of the present invention. It shows a die with C4 solder bumps provided by the IC producer. There are many different methods of forming the C4 solder bumps on the die that can be adopted, such as sputtering, evaporation and other known methods used in IC-making process. The material of C4 solder bump 2 is alloy with a specific ratio of composition, which provides the property of collapse control. The alloy used in the C4 solder bump has the ratio of 90(Pb)/10(Sn), 95(Pb)/5(Sn) or 20(Sn)/80(Au). It is feasible to adopt another alloy with the property of collapse control.

Figure 3:
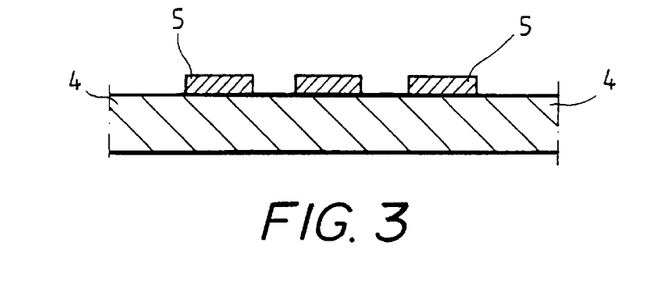
FIG. 3: a sectional view of a substrate with pads.

FIG. 3 illustrates step (2) of the present invention. It shows a substrate with a metal pad. There are many types of substrate of different materials which can be adopted. The substrate adopted in the present invention is substrate 4 with polymer material that forms printed circuits easier and has a lower cost. In FIG. 2, pads 5 on substrate 4 are formed on the side faces die 1 and are distributed over the side in positions corresponding to the positions of the solder bumps on die 1. Such a pad can offer adequate bonding for combining substrate 4 and pad 5 on die 1. In the present invention, the adopted material for the pad is copper. It is feasible to adopt other material with better bonding properties.

Figure 4:
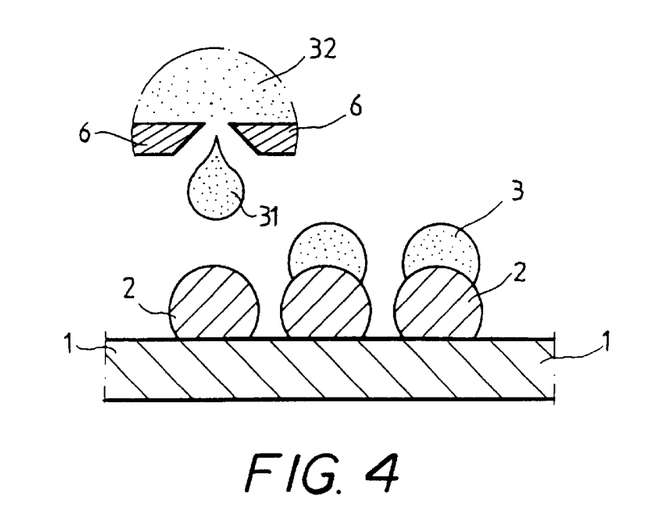
FIG. 4: a sectional view of the C4 solder bumps of a die that has been jetted by a droplet of melted second solder.
Figure 5A:
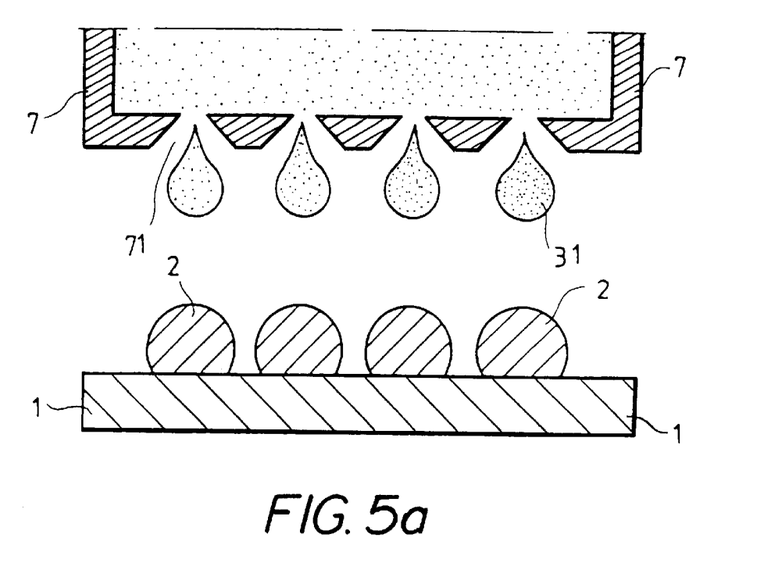
FIG. 5a: a sectional view of jetting a droplet of melted second solder onto C4 solder bumps of a die by utilizing a printhead with a mask.
Figure 5B:
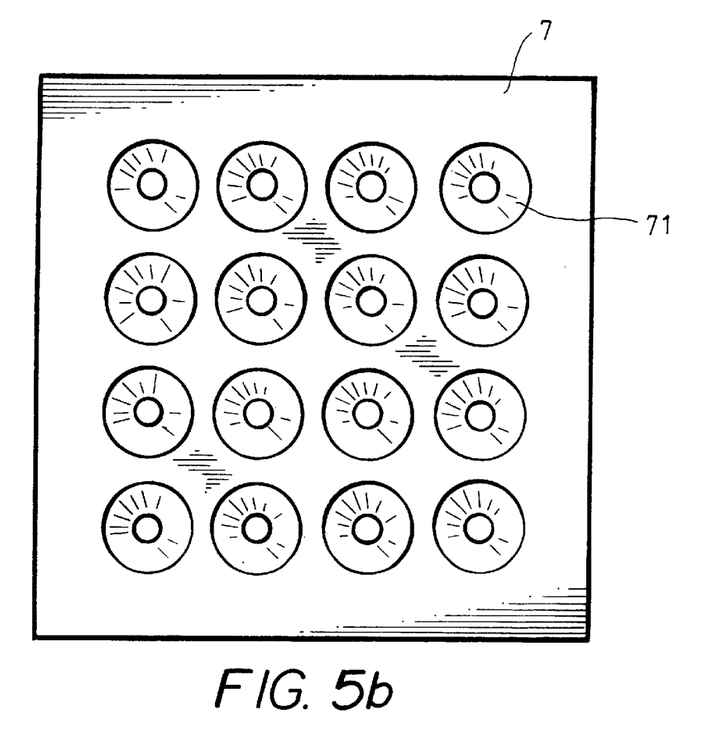
FIG. 5b: a view of the inferior surface of the mask in FIG. 5a with 4×4 orifices.

FIG. 4 illustrates step (3) of the present invention. It illustrates jetting droplet 31 of melted second solder 32 onto C4 solder bump 2, thus forming second solder bump 3. As a result of the higher melting point of C4 solder bump 2 (higher than 300° C.), substrate 4 which is formed with organic material cannot bear such a high temperature. Therefore a second solder 3 for forming a bonding medium with a lower melting point is necessary. A material with a lower melting point and better bonding capability to C4 solder bump 2 and to pad 5 for the bonding medium should be chosen. As a result of the better bonding property that is identified in the packaging field, an alloy with specific ratio of 63(Sn)/37(Pb) is adopted for second solder 3 in the present invention. The technology of jetting the droplet of melted second solder 32 is known in the packaging field. There are many types of commercial equipment that can be adopted for jetting. In the equipment, the temperature of the solder will be raised to the melting point forming liquid solder 32 and jetting it from the orifice to form the droplet. Not only is the volume of the droplet jetted from printhead 6 of the jetting equipment controlled accurately by utilizing piezoelectric material which can offer linear control, but also the position of the jetted droplet can be controlled accurately. By utilizing jetting equipment with a microprocessor (not shown in the diagram) for auto-control and mounting printhead 6 on an auto-stage (not shown in the diagram), the position for jetting (i.e., the position of the C4 solder bump) is first inputted to the microprocessor and then a droplet of the solder will be jetted into position via an auto-station with accuracy location insured by programmed controlled moving. Furthermore, control of the accuracy of the position of the jetted droplet of solder can be achieved in another way. As illustrated in FIGS. 5a and 5b, printhead 7 has a mask which provides orifices 71 according to the position of the C4 solder bump on the die. By aiming the position of the orifice at the position of the C4 solder bump, droplet 31 of melted second solder can be jetted to the position of the C4 solder bump 2 accurately.

Figure 6A:
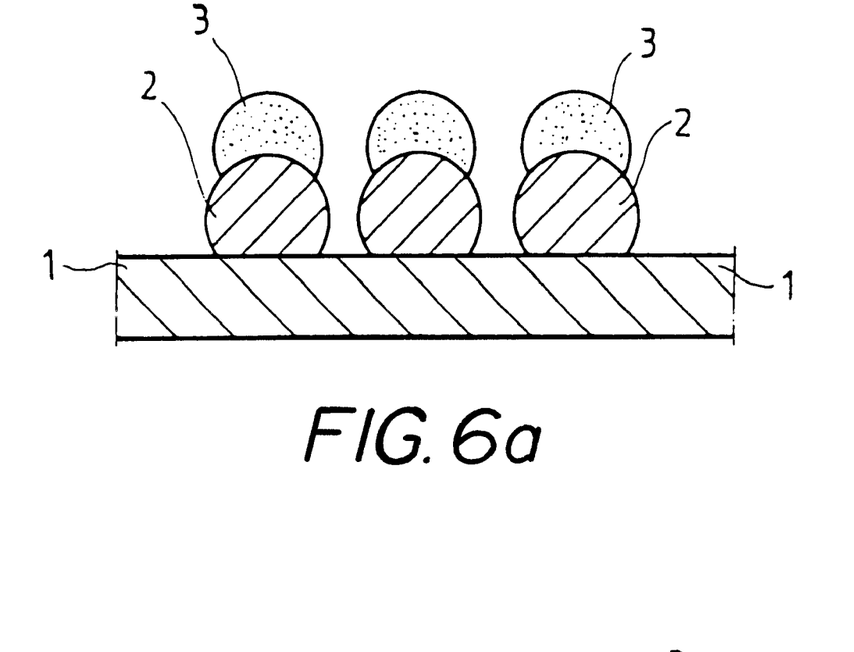
FIGS. 6a~6b: a sectional view of the second solder bump which is finished but has not finished the treatment of reflow.
Figure 6B:
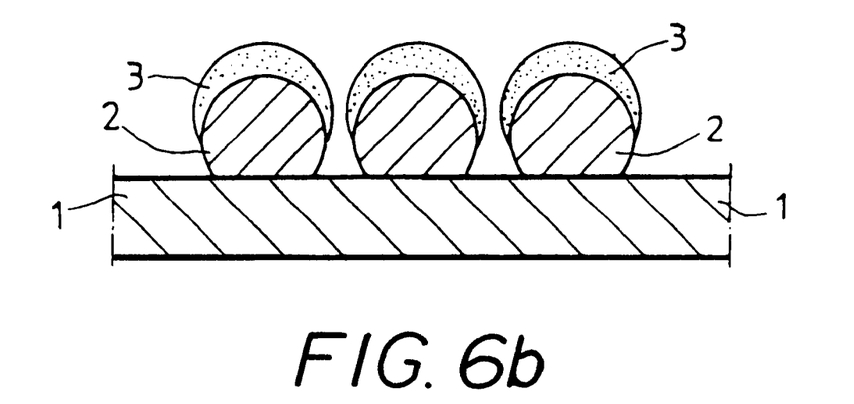

FIGS. 6a and 6b are sectional views of the die with second solder 31 that is not finished but has finished the treatment of reflow are shown separately in FIGS. 6a and 6b. After the jetting process, second solder bump 31 has not bonded sufficiently with C4 solder bump 2 yet. It is necessary to proceed with heat treatment for bonding two different materials sufficiently. Such a process is reflow step (4) of the present invention. In the process of reflow, die 1 with second solder bump 31 is sent into a reflow oven (not shown in the diagram) at atmosphere pressure,. Then the reflow proceeds at a special temperature which is a designated function of time. It is necessary to raise the special temperature to higher than the melting point of the second solder but lower than the melting point of C4 solder bump 2. In the present invention, the temperature is in the range of 183° C. to 235° C. for the second solder bump with a ratio of 63(Sn)/37(Pb) and the C4 solder bump with a ratio of 10(Pb)/90(Sn). The designated function of time is to preheat die 1 at 150° C. first, then raise the temperature to the region of 183° C.~235° C. to melt the second solder bump to bond with the C4 solder bump sufficiently. In order to avoid oxidation in the solder bump at high temperature while the die proceeds through reflow, it is necessary to provide atmospheric protection in the reflow oven. The atmosphere is 100% nitrogen gas in the present invention. After finishing the process of reflow, the second solder bump is bonded completely with the C4 solder bump as an entire solder bump 8, as shown in FIG. 6.

Figure 7A:
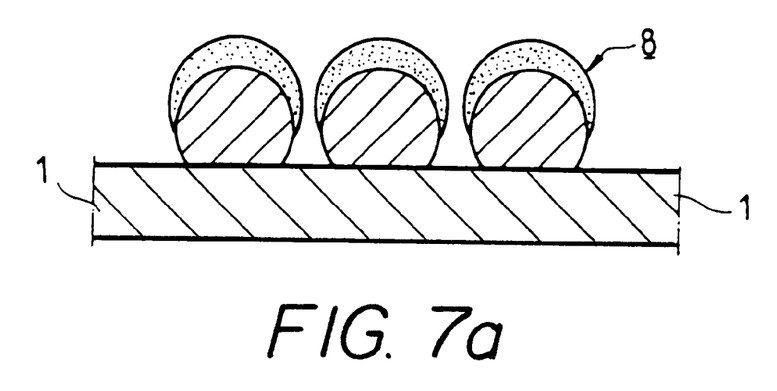
FIGS. 7a~7b: a sectional view of the second solder bump which is finished but has not finished the process of leveling.
Figure 7B:
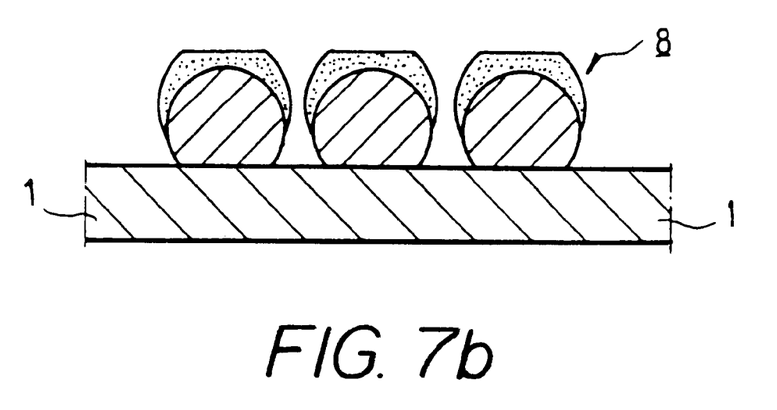
Figure 8A:
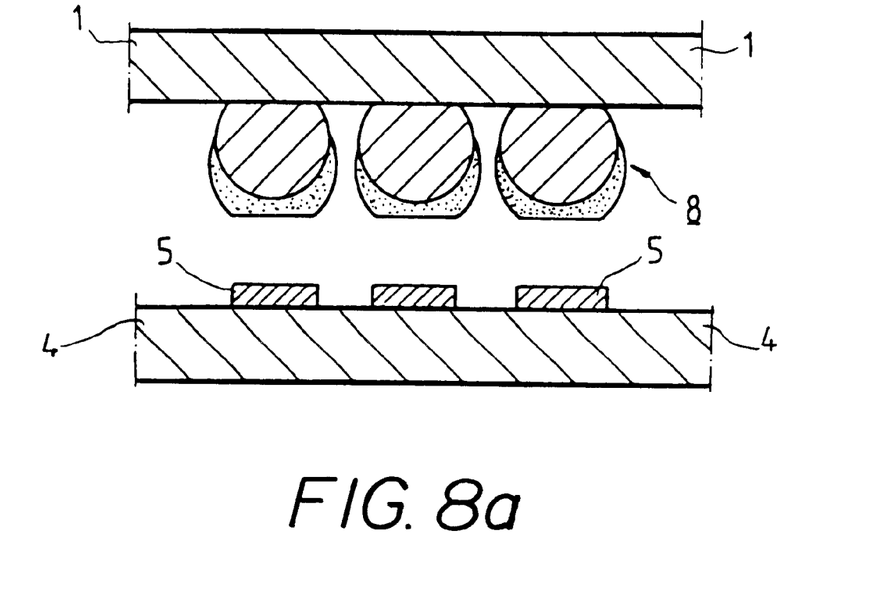
FIGS. 8a~8b: a sectional view of the die combined with the substrate.
Figure 8B:
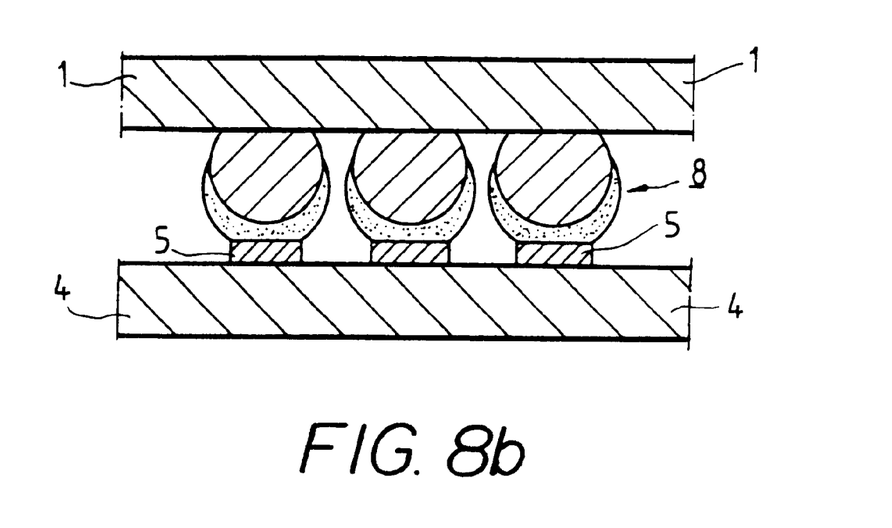

FIGS. 7a and 7b are sectional views of a die that is not finished but has finished the process of leveling are shown separately in FIG. 7a and FIG. 7b. As a result of the limitation of accuracy in position controlled by the jetting equipment, the height of solder bumps 8 is not accurate. A little deviation in the jetting position and jetting volume of the second solder will cause the heights of solder bumps 8 to be different after reflow treatment. If the difference in height is quite small, the entirety of solder bumps 8 on flipped die 1 can still be bonded completely with pads 5 after the final heat treatment. Contrarily, a large difference in height may cause the contact between the entirety of solder bumps 8 and pad 5 to be open, as shown in FIGS. 8a and 8b. The different heights of the solder bumps 8 can be made uniform by virtue of levering. If the jetting equipment can provide accurate control of position and volume of the jetted second solder, the leveling process can be omitted.

Figure 9:
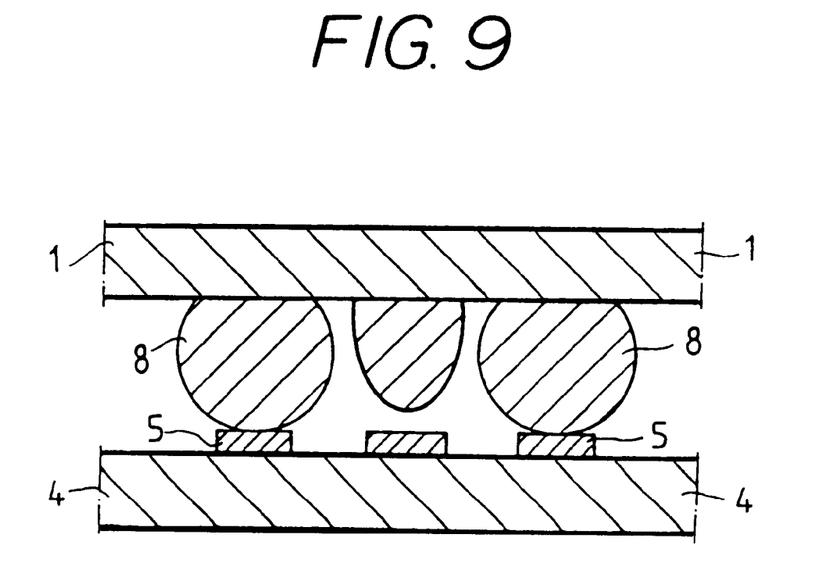
FIG. 9: a sectional view of the second solder bump before completion of the leveling process, as illustrated in the figure, wherein there is a gap between one of the solder bumps and the pad.

Referring to FIG. 9, die 1 with the entirety of solder bumps 8, all of which have identical height, is turned over. Substrate 4, with pads 5 corresponding to the entire solder bump 8, is set to have the side with pads 5 up. Die 1 is then combined with substrate 4 by aiming the position of the entirety of solder bumps 8 at the position of pads 5 and pressing down die 1 to the substrate 4. The entirety of solder bumps 8 has not bonded with the pad 5 yet. The entirety of solder bumps 8 is stuck the pad 5 by virtue of the small force pressing die 1 to substrate 4.

The final process is heat treatment of die 1 and substrate 4. After the end of step (7) of heat treatment, the two different materials of the solder bumps and pad 5 will be bonded sufficiently. As with the process of reflow, die 1 is stick to the substrate 4 and sent into a reflow oven with atmospheric protection for proceeding with the heat treatment of step (7) at a certain temperature which is a designated function of time. It is necessary to raise the certain temperature to higher than the melting point of the second solder but lower than the melting point of C4 solder bump 2. In accordance with the temperature-time curve for reflowing, die 1 is preheated at 150° C. first. Then the temperature is raised to the region of 183° C.~235° C. for melting the second solder bump and bonding with pad 5 sufficiently. The atmosphere is still nitrogen. After finishing the process of heat treatment, the entirety of solder bumps 8 is bonded completely with pad 5, and the flip chip in accordance with the present invention.

The foregoing description of preferred embodiments of the invention has been presented for purposes of illustration and description. Although the invention has been described in detail with reference to its present preferred embodiment, it will be understood by one of ordinary skill in the art that various modifications can be made without departing from the spirit and the scope of the invention, as set forth in the appended claims.

What is claimed is:

1. A method for forming flip chip with collapse-controlled solder bumps on a substrate, comprising sequentially the following steps:

providing a die with a plurality of C4 solder bumps, providing a substrate with a plurality of metal pads, jetting a droplet of melted second solder onto each said C4 solder bump to form an additional second solder bump;

reflowing the die with the additional second solder bump in order to bond the second solder bump with said C4 solder bumps to form an entire solder bump;

turning the said die over and pressing the said entire solder bump to the said metal pad;

heat treating the die and the substrate pressed to the said die in order to bond the said entirety of solder bumps to the said metal pad.

2. A method as defined in claim 1, wherein the base material of said substrate is a polymer material.

3. A method as defined in claim 1, wherein said substrate further comprising a printed circuit.

4. A method as defined in claim 1, wherein said C4 solder bump is an alloy composed of Pb and Sn, and the ratio of Pb to Sn is in the range of 90:10 to 95:5.

5. A method as defined in claim 1, wherein said second solder bump is an alloy composed of Pb and Sn, and the ratio of Sn to Pb is 63:37.

6. A method as defined in claim 5, wherein the temperature for said reflowing is in the range of 183° C. to 235° C.

7. A method as defined in claim 5, wherein the temperature for said heat treating is in the range of 183° C. to 235° C.

8. A method as defined in claim 1, wherein said reflowing process takes place in a reflow oven with atmospheric protection.

9. A method as defined in claim 8, wherein said atmosphere is nitrogen.

10. A method as defined in claim 1, wherein said jetting process further comprising the following sub-steps for jetting a plurality of the droplets:

(a) providing a mask with a plurality of printheads, wherein the position of orifice in said printhead corresponds to the position of said C4 solder bump;

(b) aiming the orifices at the positions of the C4 solder bumps on said die for localization of the jetting positions of the droplets;

(c) jetting said droplets to said C4 solder bumps.

11. A method as defined in claim 1, wherein said jetting process further comprising the following sub-steps forjetting a plurality of the droplets:

(a) providing a jetting equipment with a microprocessor and a printhead mounted on an auto-stage;

(b) inputting the data according to position of said C4 solder bump on said die into said microprocessor;

(c) controlling the auto-stage by virtue of said microprocessor for aiming said orifice of said printhead at position of said C4 solder bump;

(d) jetting the droplet to said C4 solder bump.

12. A method as defined in claim 1, further comprising a step of leveling said entire solder bump.

13. A method for forming flip chip with collapse-controlled solder bumps on a substrate comprising the steps of:

providing a die having a plurality of solder bumps;

providing a substrate with a plurality of metal pads;

forming a plurality of additional second solder bump on the plurality of first solder bumps;

reflowing the plurality of second solder bump and the first solder bump to bond the plurality of second solder bump and the plurality of first solder bump into an entire third solder bump; and bonding the additional second solder bumps to the plurality of metal pads.

* * * * *